US011606101B2

United States Patent
Moon et al.

(10) Patent No.: US 11,606,101 B2
(45) Date of Patent: Mar. 14, 2023

(54) ANALOG-TO-DIGITAL CONVERTER

(71) Applicant: SAMSUNG ELECTRONICS CO., LTD., Suwon-si (KR)

(72) Inventors: Kyoungjun Moon, Hwaseong-si (KR); Dongryeol Oh, Suwon-si (KR); Younghyo Park, Suwon-si (KR); Youngjae Cho, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/406,193

(22) Filed: Aug. 19, 2021

(65) Prior Publication Data

US 2022/0190840 A1    Jun. 16, 2022

(30) Foreign Application Priority Data

Dec. 15, 2020    (KR) .................. 10-2020-0175437

(51) Int. Cl.
*H03M 1/06* (2006.01)
*H03M 1/46* (2006.01)
*H03M 1/12* (2006.01)

(52) U.S. Cl.
CPC ......... *H03M 1/462* (2013.01); *H03M 1/0695* (2013.01); *H03M 1/122* (2013.01)

(58) Field of Classification Search
CPC ...... H03M 1/164; H03M 1/0695; H03M 1/44; H03M 1/466; H03M 1/10; H03M 1/1014;
(Continued)

(56) References Cited

U.S. PATENT DOCUMENTS 7,227,479 B1    6/2007  Chen et al.
8,207,882 B1 *  6/2012  Jennings .............. H03M 1/141
                                                341/162
(Continued)

FOREIGN PATENT DOCUMENTS

KR    10-1894902    9/2018

OTHER PUBLICATIONS

Kyoung-Jun Moon, et al. "A 9.1-ENOB 6-mW 10-Bit 500-MS/s Pipelined-SAR ADC with Current-Mode Residue Processing in 28-nm CMOS", IEEE Journal of Solid-State Circuits, vol. 54, No. 9, Sep. 2019. (Year: 2019).*

(Continued)

*Primary Examiner* — Linh V Nguyen
(74) *Attorney, Agent, or Firm* — F. Chau & Associates, LLC

(57) ABSTRACT

An analog-to-digital converter (ADC) includes a coarse ADC that receives an analog input voltage, generates a first digital signal based on the analog input voltage using a successive approximation register (SAR) method, and outputs a residual voltage remaining after the first digital signal is generated. The ADC further includes an amplifier that receives the residual voltage and a test voltage, generates a residual current by amplifying the residual voltage by a predetermined gain, and generates a test current by amplifying the test voltage by the gain. The ADC further includes a fine ADC that receives the residual current and generates a second digital signal based on the residual current using the SAR method, and an auxiliary path that receives the test current and generates a gain correction signal based on the test current. The gain of the amplifier is adjusted based on the gain correction signal.

15 Claims, 11 Drawing Sheets

(58) Field of Classification Search
CPC .. H03M 1/1215; H03M 1/1245; H03M 1/462; H03M 1/50; H03M 1/004; H03M 1/007; H03M 1/0626; H03M 1/0639; H03M 1/1009; H03M 1/1019; H03M 1/1033; H03M 1/1042; H03M 1/1061; H03M 1/12; H03M 1/121; H03M 1/122; H03M 1/1225; H03M 1/1295; H03M 1/145; H03M 1/168; H03M 1/18; H03M 1/38; H03M 1/468; H03M 1/804
USPC ............... 341/118, 140, 141, 155, 161, 162
See application file for complete search history.

(56) References Cited

U.S. PATENT DOCUMENTS

| | | | |
|---|---|---|---|
| 8,358,228 B2* | 1/2013 | Ali | H03M 1/1014 341/161 |
| 8,368,571 B2 | 2/2013 | Siragusa | |
| 8,497,790 B1* | 7/2013 | Lewis | H03M 1/1019 341/120 |
| 8,564,462 B2 | 10/2013 | Gomez et al. | |
| 9,287,889 B2 | 3/2016 | Chiu et al. | |
| 9,369,140 B1* | 6/2016 | Sundaresan | G01S 7/52025 |
| 9,413,373 B1* | 8/2016 | Ishii | H03M 1/1061 |
| 10,608,655 B1* | 3/2020 | Li | H03M 1/1057 |
| 2007/0176814 A1 | 8/2007 | Grace | |
| 2013/0120174 A1 | 5/2013 | Ali | |
| 2013/0187801 A1* | 7/2013 | de Figueiredo | H03M 1/1061 341/118 |
| 2016/0065230 A1 | 3/2016 | Mulder | |
| 2017/0012639 A1 | 1/2017 | Bogner | |
| 2019/0181872 A1* | 6/2019 | Lin | H04B 1/401 |
| 2020/0382128 A1* | 12/2020 | Naru | H03M 1/46 |

OTHER PUBLICATIONS

Kyoung-Jun Moon, et al. "A 9.1-ENOB 6-mW 10-Bit 500-MS/s Pipelined-SAR ADC With Current-Mode Residue Processing in 28-nm CMOS", IEEE Journal of Solid-State Circuits, vol. 54, No. 9, Sep. 2019.

* cited by examiner

ANALOG-TO-DIGITAL CONVERTER

CROSS-REFERENCE TO RELATED APPLICATION(S)

This application claims priority under 35 U.S.C. § 119 to Korean Patent Application No. 10-2020-0175437, filed on Dec. 15, 2020 in the Korean Intellectual Property Office, the disclosure of which is incorporated by reference herein in its entirety.

TECHNICAL FIELD

Embodiments of the present inventive concept relate to an analog-to-digital converter.

DISCUSSION OF RELATED ART

Recently, the development of a time-interleaved analog-to-digital converter (TIADC) has been actively conducted for 5th generation (5G) general purpose application communication. A TIADC increases ADC conversion performance by a time-interleaved operation of multiple single ADC channels in parallel. To secure a high-speed TIADC, an operating speed of a single ADC channel and the number of ADC channels may be increased.

SUMMARY

Embodiments of the present inventive concept provide a voltage-current domain pipeline successive approximation register (SAR) analog-to-digital converter (ADC) in which a time for an ADC to operate normally and a time for correcting an interstage gain error are respectively separated.

According to an embodiment of the present inventive concept, an ADC includes a coarse ADC that receives an analog input voltage, generates a first digital signal based on the analog input voltage using a successive approximation register (SAR) method, and outputs a residual voltage remaining after the first digital signal is generated. The ADC further includes an amplifier that receives the residual voltage and a test voltage, generates a residual current by amplifying the residual voltage by a predetermined gain, and generates a test current by amplifying the test voltage by the gain. The ADC further includes a fine ADC that receives the residual current and generates a second digital signal based on the residual current using the SAR method, and an auxiliary path that receives the test current and generates a gain correction signal based on the test current. The gain of the amplifier is adjusted based on the gain correction signal.

According to an embodiment of the present inventive concept, an ADC includes a coarse ADC that samples an analog input voltage for a first period, generates a first digital signal based on the analog input voltage using a successive approximation register (SAR) method for a second period, and outputs a residual voltage remaining after the first digital signal is generated. The ADC further includes an amplifier that receives the residual voltage for a third period, and generates a residual current by amplifying the residual voltage by a predetermined gain. The ADC further includes a fine ADC that receives the residual current for a fourth period, and generates a second digital signal based on the residual current using the SAR method. The ADC further includes an auxiliary path that generates a gain correction signal. The gain of the amplifier is adjusted for the fourth period in which the fine ADC generates the second digital signal based on the residual current.

According to an embodiment of the present inventive concept, an ADC includes a coarse ADC that receives an analog input voltage, generates a first digital signal based on the analog input voltage using a successive approximation register (SAR) method, and outputs a residual voltage remaining after the first digital signal is generated. The ADC further includes a test voltage generator that outputs a test voltage, and a selector that outputs one of the residual voltage and the test voltage in response to a selection signal. The ADC further includes an amplifier that receives the residual voltage and the test voltage from the selector, generates a first residual current by amplifying the residual voltage by a predetermined gain, and generates a test current by amplifying the test voltage by the gain. The ADC further includes a fine ADC that receives the first residual current, generates a second digital signal based on the first residual current using the SAR method, and outputs a second residual current remaining after the second digital signal is generated. The ADC further includes an auxiliary path that receives the test current, and generates a gain correction signal based on the test current. The gain of the amplifier is adjusted based on the gain correction signal. The ADC further includes a gain correction circuit that outputs a control signal that controls the amplifier such that the amplifier corrects the gain based on the gain correction signal. Regardless of a time at which the fine ADC converts the first residual current into the second digital signal, the auxiliary path generates the gain correction signal based on the test current.

According to an embodiment of the present inventive concept, an ADC includes a voltage-current converter that receives an analog input voltage, generates a first digital signal based on the analog input voltage using a successive approximation register (SAR) method, generates a first residual current by amplifying a residual voltage remaining after the first digital signal is generated by a predetermined gain, generates a second digital signal based on the first residual current using the SAR method, and outputs a second residual current remaining after the second digital signal is generated. The ADC further includes a current-time converter that receives the second residual current, and converts the second residual current into a residual time in a time domain. The ADC further includes a time-digital converter that receives the residual time, and generates a third digital time based on the residual time. The gain is corrected regardless of a time at which the voltage-current converter generates the second digital signal.

BRIEF DESCRIPTION OF DRAWINGS

The above and other features of the present inventive concept will become more apparent by describing in detail embodiments thereof with reference to the accompanying drawings, in which.

DETAILED DESCRIPTION

Figure 1:
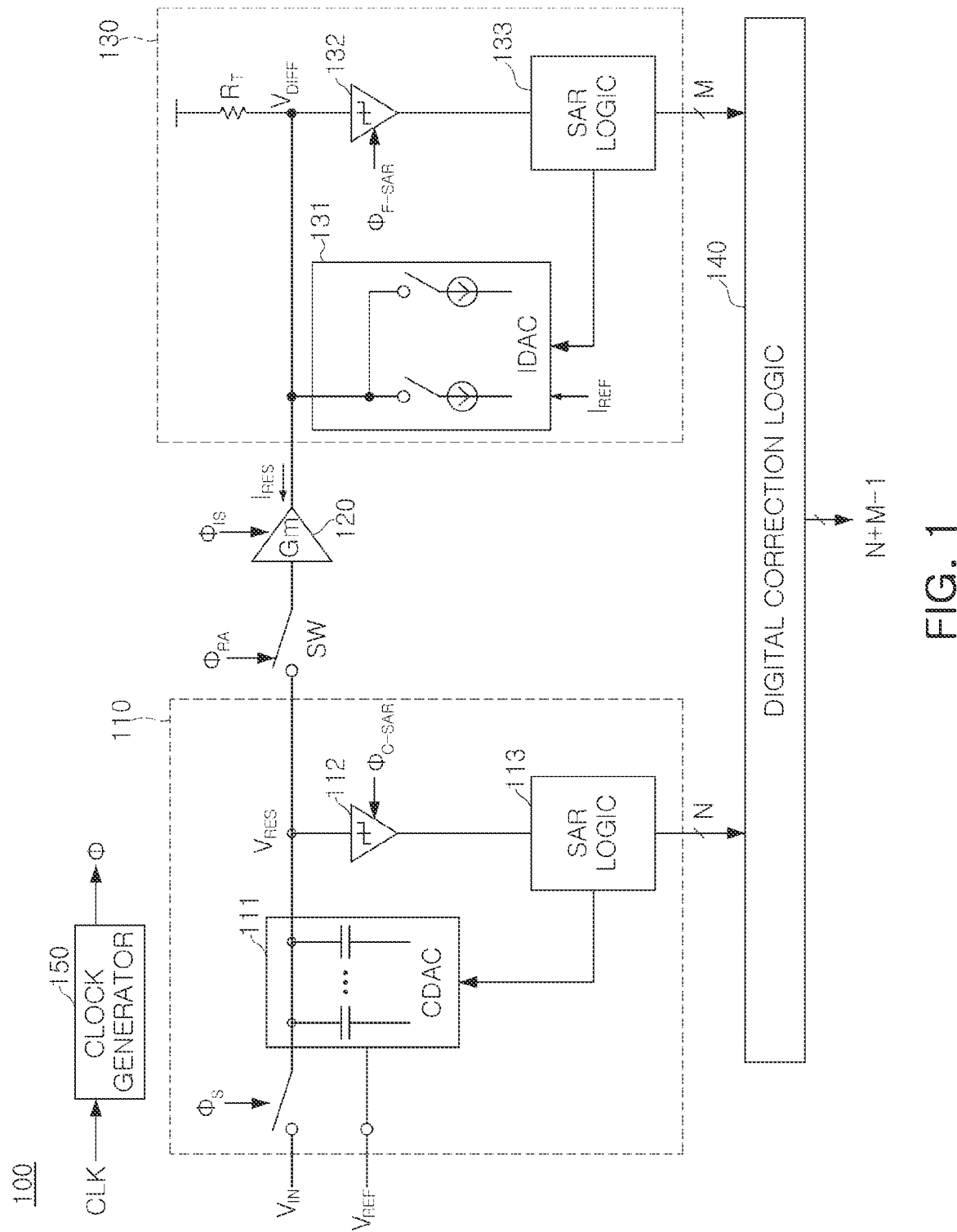
FIG. 1 illustrates a structure of a voltage-current domain pipeline successive approximation register (SAR) analog-to-digital converter (ADC) according to an example embodiment of the present inventive concept.

Example embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

In the present specification, a full scale or a full scale range of an output may mean a difference between a maximum value of the output and a minimum value of the output, or a range between the maximum value of the output and the minimum value of the output.

FIG. 1 illustrates a structure of a voltage-current domain pipeline successive approximation register (SAR) analog-to-digital converter (ADC) according to an example embodiment of the present inventive concept.

Referring to FIG. 1, a voltage-current domain pipeline SAR ADC 100 may generate a sequence of digital codes (e.g., (N+M−1)-bit digital signal) representing respective levels of an analog input voltage ($V_{IN}$) using an SAR method, in which N and M are natural numbers. The voltage-current domain pipeline SAR ADC 100 may include a coarse ADC 110, an amplifier 120, a fine ADC 130, and a digital correction logic 140.

The coarse ADC 110 may include a capacitive digital analog converter (CDAC) 111, and may output an N-bit digital signal from the analog input voltage ($V_{IN}$) using the SAR method.

The amplifier 120 may receive the differential residual voltage ($V_{RES}$) from the coarse ADC 110. The amplifier 120 may perform voltage-current conversion from a differential residual voltage ($V_{RES}$) to a differential residual current ($I_{RES}$) in a current domain. For example, the amplifier 120 may generate the differential residual current ($I_{RES}$) by amplifying the differential residual voltage ($V_{RES}$) by a predetermined gain Gm. In addition, the amplifier 120 may sample the generated differential residual current ($I_{RES}$), and maintain the sampled differential residual current at a constant value for a predetermined period.

The fine ADC 130 may include a current DAC (IDAC) 131, and may output an M-bit digital signal from the differential residual current ($I_{RES}$) using the SAR method.

The digital correction logic 140 may receive an N-bit digital signal from the coarse ADC 110, and may receive an M-bit digital signal from the fine ADC 130. When a 1-bit redundancy exists between the coarse ADC 110 and the fine ADC 130, the digital correction logic 140 may combine the N-bit digital signal and the M-bit digital signal to generate a (N+M−1)-bit digital signal.

Hereinafter, the normal operation of the voltage-current domain pipeline SAR ADC 100 will be described in detail.

The coarse ADC 110 may include the CDAC 111, a comparator 112, and an SAR logic 113. The coarse ADC 110 may receive the analog input voltage ($V_{IN}$) and a reference voltage ($V_{REF}$). The analog input voltage may be a CDAC input voltage. The CDAC 111 may sample the analog input voltage ($V_{IN}$) in response to a first sampling clock ($\Phi_S$), and maintain the sampled analog signal at a constant value for a predetermined period. The CDAC 111 may receive the reference voltage ($V_{REF}$), and may generate a CDAC reference voltage using the reference voltage ($V_{REF}$). The CDAC 111 may output the differential residual voltage ($V_{RES}$) corresponding to a difference between the CDAC input voltage and the CDAC reference voltage.

The comparator 112 may compare the differential residual voltage ($V_{RES}$) in response to the first comparison clock ($\Phi_{C\text{-}SAR}$) and output a result of the comparison. The SAR logic 113 may output a digital signal of a most significant bit based on the result of the comparison output from the comparator 112. For example, when the CDAC input voltage is greater than the CDAC reference voltage, the SAR logic 113 may output a first logic value (e.g., data "1"). However, when the CDAC input voltage is lower than the CDAC reference voltage, the SAR logic 113 may output a second logic value (e.g., data "0").

In addition, the SAR logic 113 may control the CDAC 111 so that the CDAC 111 may generate a new CDAC reference voltage based on the result of the comparison output from the comparator 112.

The CDAC 111 may output the differential residual voltage ($V_{RES}$) corresponding to a difference between the CDAC input voltage and the new CDAC reference voltage. The comparator 112 may compare the differential residual voltage ($V_{RES}$) in response to the first comparison clock ($\Phi_{C\text{-}SAR}$) and output a result of the comparison. The SAR logic 113 may output a digital signal of a next bit based on the result of the comparison output from the comparator 112.

The coarse ADC 110 may perform an SAR method until all bits of N-bit digital signals are determined from the analog input voltage ($V_{IN}$). The coarse ADC 110 may output the residual differential voltage ($V_{RES}$) remaining after the N-bit digital signal is generated.

The amplifier 120 may receive the differential residual voltage ($V_{RES}$) in response to a switch clock ($\Phi_{RA}$) which may be transmitted to the amplifier 120 via a switch SW. The amplifier 120 may perform voltage-current conversion from the differential residual voltage ($V_{RES}$) to the differential residual current ($I_{RES}$) in a current domain. For example, the amplifier 120 may amplify the differential residual voltage ($V_{RES}$) by a predetermined gain Gm to generate a differential residual current ($I_{RES}$). In addition, the amplifier 120 may sample the generated differential residual current ($I_{RES}$) in response to a second sampling clock ($\Phi_{IS}$), and maintain the sampled differential residual current at a constant value for a predetermined period.

The fine ADC 130 may include the IDAC 131, a comparator 132, and an SAR logic 133. The differential residual current ($I_{RES}$) may be an IDAC input current. The IDAC 131 may receive a reference current ($I_{REF}$), and generate an IDAC reference current using the reference current ($I_{REF}$). The IDAC 131 may output a differential voltage ($V_{DIFF}$) determined by a difference between the IDAC input current and the IDAC reference current. That is, the IDAC 131 may output a differential voltage ($V_{DIFF}$) corresponding to a difference between the IDAC input current and the IDAC reference current using a resistor ($R_T$).

The comparator 132 may compare the differential voltage ($V_{DIFF}$) in response to a second comparison clock ($\Phi_{F\text{-}SAR}$) and output a result of the comparison. The SAR logic 133 may output a digital signal of a most significant bit based on the result of the comparison output from the comparator 132.

In addition, the SAR logic 133 may control the IDAC 131 so that the IDAC 131 may generate a new IDAC reference current based on the result of the comparison output from the comparator 132.

The IDAC 131 may output the differential voltage ($V_{DIFF}$) corresponding to a difference between the IDAC input current and the new IDAC reference current using the resistor ($R_T$). The comparator 132 may compare the differential voltage in response to the second comparison clock ($\Phi_{F\text{-}SAR}$) and output a result of the comparison. The SAR logic 133 may output a digital signal of a next bit based on the result of the comparison output from the comparator 132.

The fine ADC 130 may perform an SAR method until all bits of M-bit digital signals are determined from the differential residual current ($I_{RES}$).

The digital correction logic 140 may receive an N-bit digital signal from the coarse ADC 110, and may receive an M-bit digital signal from the fine ADC 130. When there is a 1-bit redundancy between the coarse ADC 110 and the fine ADC 130, the digital correction logic 140 may combine an N-bit digital signal and an M-bit digital signal to generate total (N+M−1)-bit digital signals.

Figure 2:
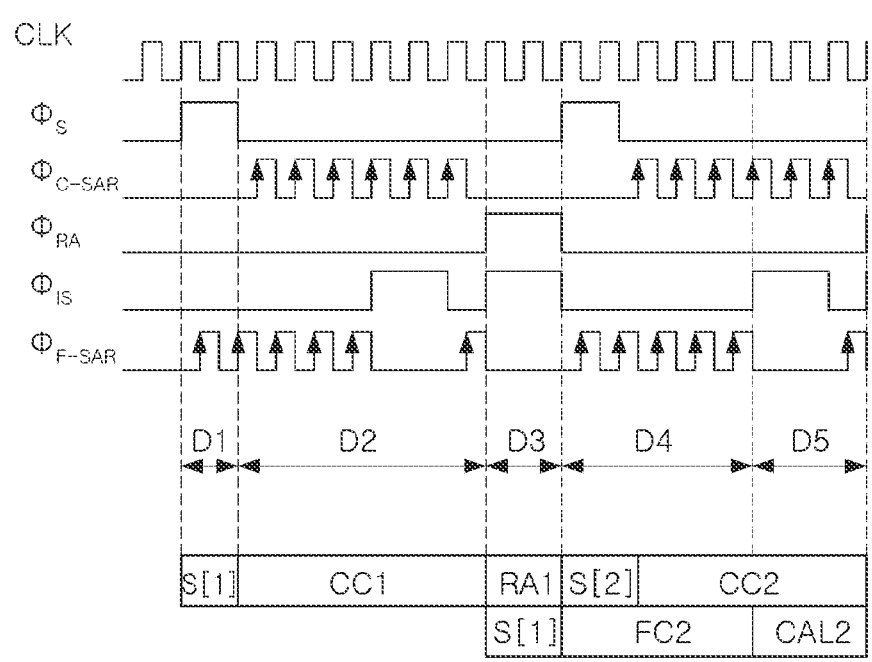
FIG. 2 is a timing diagram illustrating a normal operation of a voltage-current domain pipeline SAR ADC according to an example embodiment of the present inventive concept.

FIG. 2 is a timing diagram illustrating a normal operation of a voltage-current domain pipeline SAR ADC according to an example embodiment of the present inventive concept.

Referring to FIGS. 1 and 2 together, the clock generator 150 may generate the first sampling clock ($\Phi_S$), the first comparison clock ($\Phi_{C\text{-}SAR}$), the switch clock ($\Phi_{RA}$), the second sampling clock ($\Phi_{IS}$), and the second comparison clock ($\Phi_{F\text{-}SAR}$) in response to the clock signal CLK. The first sampling clock ($\Phi_S$) may have a pulse width corresponding to 1.5 clock cycles, and the first comparison clock ($\Phi_{C\text{-}SAR}$) may include 6.5 clock cycles. Each of the switch clock ($\Phi_{RA}$) and the second sampling clock ($\Phi_{IS}$) may have a pulse width corresponding to two clock cycles.

In a first period D1, the analog input voltage ($V_{IN}$) may be sampled by the CDAC 111 when a first sampling clock ($\Phi_S$) is activated (S11). In a second period D2, then analog input voltage ($V_{IN}$) may be converted into an N-bit digital signal by the comparator 112 and the SAR logic 113 when a first comparison clock ($\Phi_{C\text{-}SAR}$) is activated and then be output (CC1). When an operation of the coarse ADC 110 is completed, the differential residual voltage ($V_{RES}$) may remain in the CDAC 111.

In a third period D3, the differential residual voltage ($V_{RES}$) remaining in the CDAC 111 may be converted into the differential residual current ($I_{RES}$) by the amplifier 120 when the second sampling clock ($\Phi_{IS}$) is activated (RA1). When a total of 10 clock cycles is finished, the differential residual current ($I_{RES}$) may be sampled by the amplifier 120.

In a fourth period D4, an operation of the coarse ADC 110 is in progress (S[2] and CC2), and the differential residual current ($I_{RES}$) may be converted into an M-bit digital signal by the fine ADC 130 when the second comparison clock ($\Phi_{F\text{-}SAR}$) is activated and then be output (FC2). In a fifth period D5, a calibration circuit may perform gain calibration and offset calibration of the amplifier 120 and the fine ADC 130 during three clock cycles (CAL2).

A gain Gm of the amplifier 120 is sensitive to a change in process voltage temperature (PVT). Accordingly, mismatching may occur between a full scale of the differential residual voltage ($V_{RES}$) and a full scale of the differential residual current ($I_{RES}$) according to the PVT change. That is, an interstage gain error may occur according to a PVT change. Therefore, example embodiments correct the gain Gm of the amplifier 120.

To reduce the influence of PVT, the gain Gm of the amplifier 120 may be corrected in the background during normal operation of the ADC. As an example, in the fifth section D5 after the normal operation time at which the fine ADC 130 converts the differential residual current ($I_{RES}$) into an M-bit digital signal, hardware of the fine ADC 130, for example, the IDAC 131, the SAR logic 133, and the comparator 132, may be used to correct the gain Gm of the amplifier 120. Accordingly, an area taken by a circuit and power consumption may be reduced or minimized. However, a gain correction time allocated within the normal operation time of the fine ADC 130 may become a burden in maximizing or increasing the operation speed of a single channel.

According to an example embodiment of the present inventive concept, a circuit for correcting the gain of the amplifier may be added to the voltage-current domain pipeline SAR ADC to separate the normal operation time and the gain correction time of the fine ADC. Therefore, the operation speed of the ADC while compensating the gain of the amplifier in the background may be increased or maximized.

Figure 3:
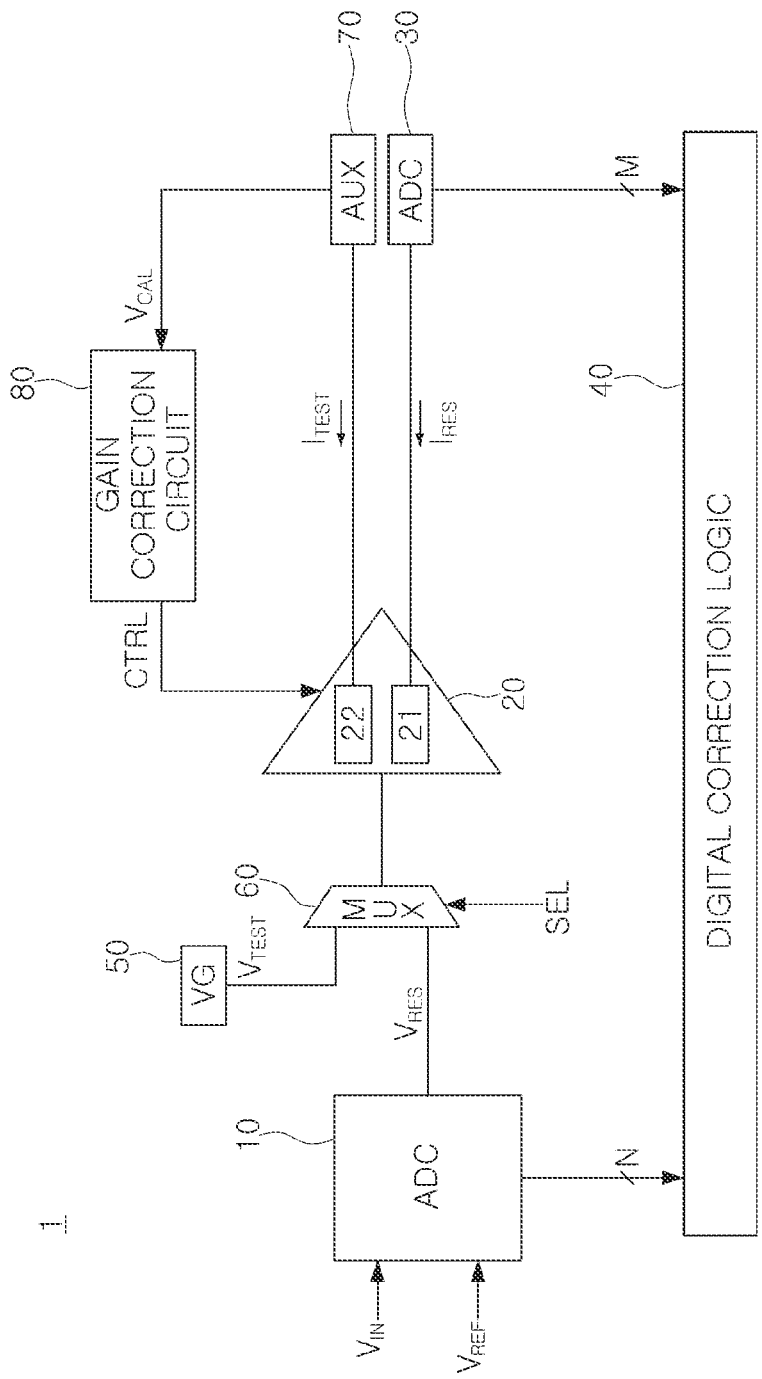
FIG. 3 is a block diagram illustrating a structure of a voltage-current domain pipeline SAR ADC according to an example embodiment of the present inventive concept.

FIG. 3 is a block diagram illustrating a structure of a voltage-current domain pipeline SAR ADC according to an example embodiment of the present inventive concept.

Referring to FIG. 3, a voltage-current domain pipeline SAR ADC 1 may further include a circuit for correcting the gain of an amplifier 20 in addition to circuits utilized to normally operate the ADC 1, a coarse ADC 10, the amplifier 20, a fine ADC 30, and a digital correction logic 40.

As an example, the amplifier 20 may further include a second switched current sampler 22 used to correct the gain of the amplifier 20 in addition to a first switched current sampler 21 used for normal operation of the ADC.

In addition, the voltage-current domain pipeline SAR ADC 1 may further include an auxiliary path 70 used to correct the gain of an amplifier 20. For example, the fine ADC 30 may include an IDAC and a comparator, and the auxiliary path 70 may include an IDAC and a comparator which respectively have the same configuration as the IDAC and the comparator included in the fine ADC 30. In an example embodiment, the fine ADC 30 may include a first IDAC and a comparator, and the auxiliary path 70 may include a second IDAC, and may share the comparator included in the fine ADC 30 with the fine ADC 30 with each other. The second IDAC may have the same configuration as an IDAC which is the same as the first IDAC of the fine ADC 30. IDACs having the same configuration as each other may also be referred to herein as replica IDACs.

In addition, the voltage-current domain pipeline SAR ADC 1 may further include a test voltage generator 50, a selector 60, and a gain correction circuit 80 for correcting the gain of the amplifier.

The coarse ADC 10 may receive the analog input voltage ($V_{IN}$), generate an N-bit first digital signal from the analog input voltage ($V_{IN}$) using an SAR method, and output the residual voltage ($V_{RES}$) remaining after the N-bit first digital signal is generated.

The test voltage generator 50 may output a test voltage ($V_{TEST}$). The selector 60 may receive the residual voltage ($V_{RES}$) and the test voltage ($V_{TEST}$). The selector 60 may output one of the residual voltage ($V_{RES}$) and the test voltage ($V_{TEST}$) in response to a selection signal SEL.

The amplifier 20 may receive the residual voltage ($V_{RES}$) and the test voltage ($V_{TEST}$) from the selector 60. The amplifier 20 may receive the residual voltage ($V_{RES}$), and amplify the residual voltage ($V_{RES}$) by a predetermined gain to generate the residual current ($I_{RES}$). The amplifier 20 may receive the test voltage ($V_{TEST}$), and amplify the test voltage ($V_{TEST}$) by the gain to generate a test current ($I_{TEST}$).

The amplifier 20 may convert the residual voltage ($V_{RES}$) into the residual current ($I_{RES}$) using a first switched current sampler 21, and then the amplifier 20 may convert the test voltage ($V_{TEST}$) into a test current ($I_{TEST}$) using the second switched current sampler 22.

The fine ADC 30 may receive the residual current ($I_{RES}$) from the amplifier 20, and generate an M-bit second digital signal from the residual current ($I_{RES}$) using the SAR method.

The digital correction logic 40 may combine a first N-bit digital signal and a second M-bit digital signal to generate a total (N+M−1)-bit digital signal.

During a time at which a voltage-current domain pipeline SAR ADC 1 operates normally, the voltage-current domain pipeline SAR ADC 1 may correct a gain of the amplifier 20 using the auxiliary path 70. That is, regardless of the time at which the fine ADC 30 converts the residual current ($I_{RES}$) into the M-bit second digital signal, the auxiliary path 70 may generate a gain correction signal ($V_{CAL}$) used to correct the gain of the amplifier 20.

For example, while the fine ADC 30 converts the residual current ($I_{RES}$) into the M-bit second digital signal, the auxiliary path 70 may receive the test current ($I_{TEST}$) from the amplifier 20, and may generate the gain correction signal ($V_{CAL}$) used to correct the gain of the amplifier from the test current ($I_{TEST}$).

The gain correction circuit 80 may output a control signal CTRL that controls the amplifier 20 so that the amplifier 20 corrects the gain of the amplifier 20, based on the gain correction signal ($V_{CAL}$).

Hereinafter, a structure and an operation of the voltage-current domain pipeline SAR ADC 1 of FIG. 3 will be described in more detail.

Figure 4:
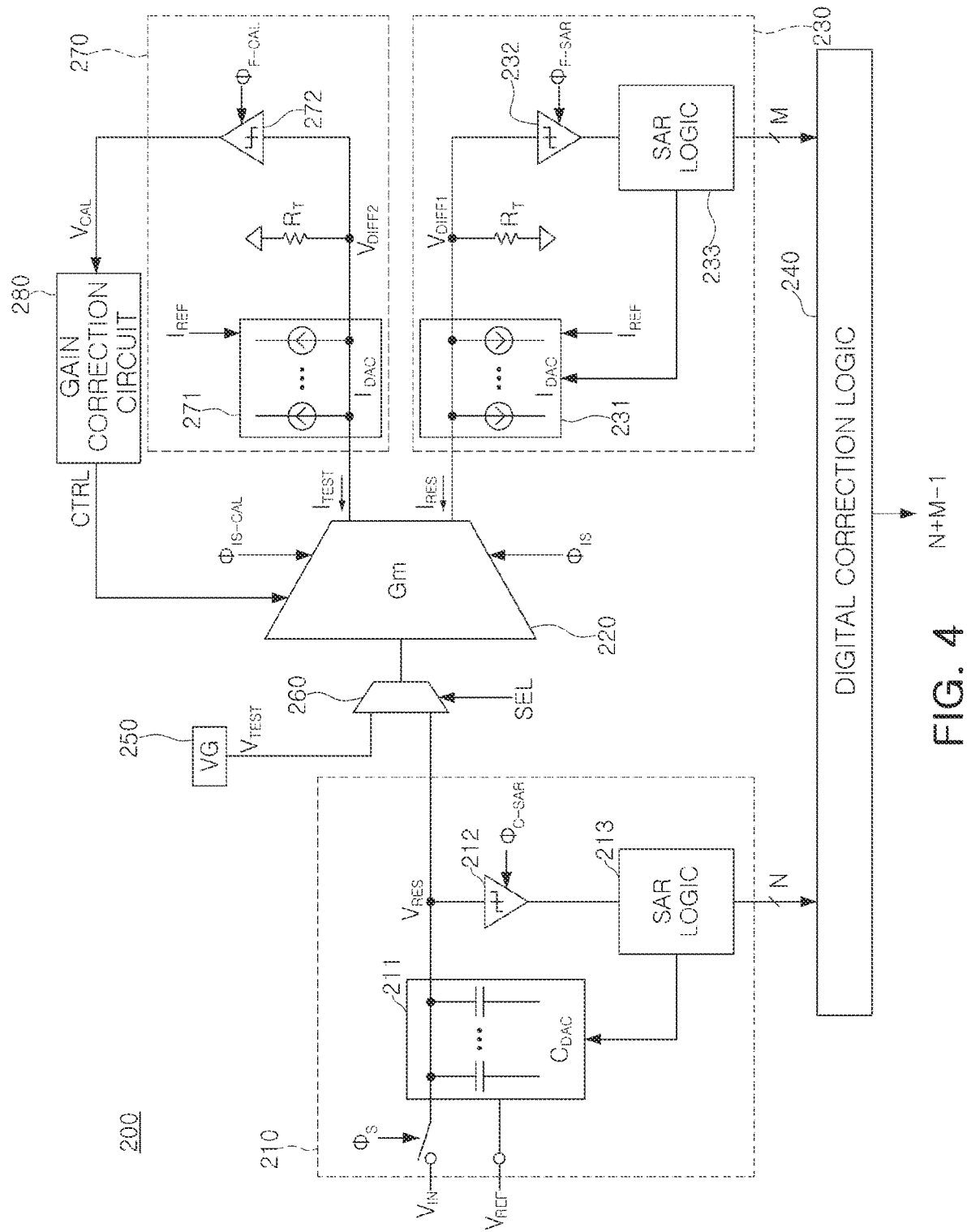
FIGS. 4 and 5 are diagrams for explaining a method of correcting a gain of an amplifier by a voltage-current domain pipeline SAR ADC according to an example embodiment of the present inventive concept.
Figure 5:
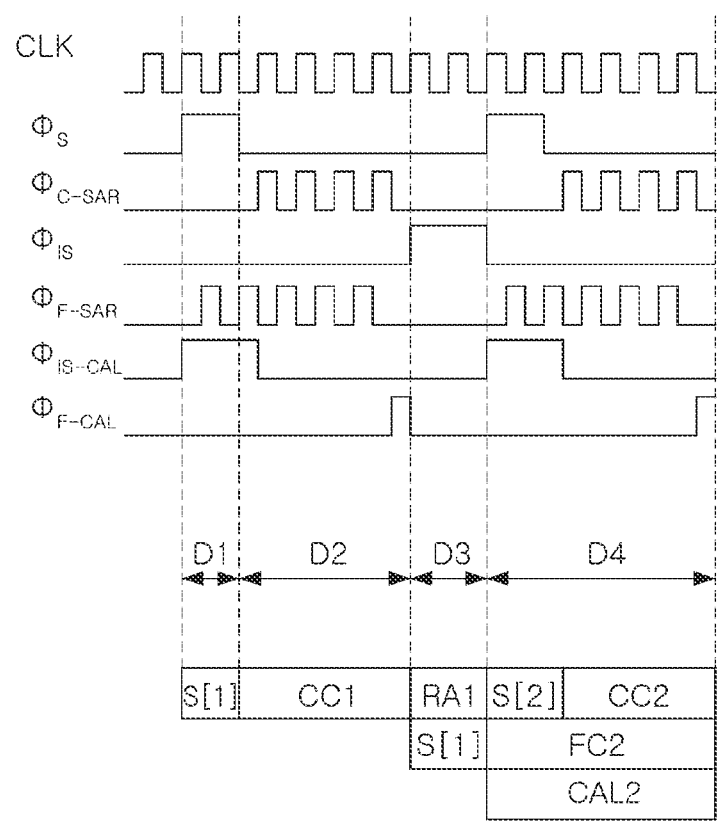

FIGS. 4 and 5 are diagrams for explaining a method of correcting a gain of an amplifier by a voltage-current domain pipeline SAR ADC according to an example embodiment of the present inventive concept.

Referring to FIG. 4, the differences between FIG. 4 and FIG. 1 are primarily described, and a further description of components and technical aspects previously described may be omitted for convenience of explanation. Referring to FIG. 4, a voltage-current domain pipeline SAR ADC 200 may further include a test voltage generator 250, a first selector 260, an auxiliary path 270, and a gain correction circuit 280, in addition to a coarse ADC 210, an amplifier 220, a fine ADC 230, and a digital correction logic 240. The coarse ADC 210, the amplifier 220, the fine ADC 230, and the digital correction logic 240 of FIG. 4 may be similar to the coarse ADC 110, the amplifier 120, the fine ADC 130, and the digital correction logic 140 of FIG. 1, respectively.

The first selector 260 may receive the differential residual voltage ($V_{RES}$) from the coarse ADC 210, and may receive the differential test voltage ($V_{TEST}$) from the test voltage generator 250. The first selector 260 may output one of the differential residual voltage ($V_{RES}$) and the differential test voltage ($V_{TEST}$) in response to a first selection signal SEL1.

When the amplifier 220 receives the differential residual voltage ($V_{RES}$) from the first selector 260, the amplifier 220 may amplify the differential residual voltage ($V_{RES}$) by a predetermined gain Gm to generate the differential residual current ($I_{RES}$). The amplifier 120 may sample the generated differential residual current ($I_{RES}$) in response to the second sampling clock ($\Phi_{IS}$), and maintain the sampled differential residual current at a constant value for a predetermined period. The fine ADC 230 may receive the differential residual current ($I_{RES}$) from the amplifier 220 and generate an M-bit digital signal.

After the amplifier 220 converts the differential residual voltage ($V_{RES}$) into the differential residual current ($I_{RES}$), the amplifier 220 may receive the differential test voltage ($V_{TEST}$) from the first selector 260. The amplifier 220 may amplify the differential test voltage ($V_{TEST}$) by a predetermined gain Gm to generate the differential test current ($I_{TEST}$). The amplifier 120 may sample the generated differential test current ($I_{TEST}$) in response to a correction sampling clock ($\Phi_{IS-CAL}$), and maintain the sampled differential test current at a constant value for a predetermined period.

The auxiliary path 270 may include an IDAC 271 and a comparator 272 that have a same configuration as an IDAC 231 and a comparator 232 of the fine ADC 230. The IDAC 231 and the comparator 232 of the fine ADC 230 of FIG. 4 may be the same as or similar to the IDAC 131 and the comparator 132 of the fine ADC 130 of FIG. 1. The differential test current ($I_{TEST}$) may be an IDAC input current. The IDAC 271 may receive the reference current ($I_{REF}$), and may generate an IDAC reference current using the reference current ($I_{REF}$). The IDAC 271 may output a second differential voltage ($V_{DIFF}2$) corresponding to a difference between the IDAC input current and the IDAC reference current using the resistor ($R_T$). The IDAC 231 may output a first differential voltage ($V_{DIFF1}$).

The comparator 272 may compare the second differential voltage ($V_{DIFF}2$) in response to a correction comparison clock ($\Phi_{F-CAL}$) and output a result of the comparison. For example, the comparator 272 may compare a full scale of the differential test current ($I_{TEST}$) with a full scale of the reference current ($I_{REF}$), and output a result of the comparison as the gain correction signal ($V_{CAL}$).

Based on the gain correction signal ($V_{CAL}$) output from the comparator 272, the gain correction circuit 280 may generate the control signal CTRL that controls the amplifier 220 so that the amplifier 220 corrects the gain of the amplifier 220. For example, when the comparison result of the comparator 272 indicates that the gain of the amplifier 220 has decreased, the control signal CTRL may be a signal that increases the gain of the amplifier 220. Conversely, when the comparison result of the comparator 272 indicates that the gain of the amplifier 220 is increased, the control signal CTRL may be a signal that reduces the gain of the amplifier 220.

That is, the voltage-current domain pipeline SAR ADC 200 may compare a full scale of the differential test current ($I_{TEST}$) with a full scale of the reference current ($I_{REF}$) using an additional circuit for correcting the gain of the amplifier 220, and adjust the gain of the amplifier 220 so that the full scale of the differential test current ($I_{TEST}$) and the full scale of the reference current ($I_{REF}$) match.

Referring to FIGS. 4 and 5 together, in a first period D1, the analog input voltage ($V_{IN}$) may be sampled by a CDAC 211 during a first sampling clock ($\Phi_S$) (S[1]). The CDAC 211 of FIG. 4 may be the same as or similar to the CDAC 111 of FIG. 1. In a second period D2, the analog input voltage ($V_{IN}$) may be converted into an N-bit digital signal by a comparator 212 and an SAR logic 213 during a first comparison clock ($\Phi_{C-SAR}$) and output (CC1). The comparator 212, the SAR logic 213, and the SAR logic 233 of FIG. 4 may be the same as or similar to the comparator 112, the SAR logic 113, and the SAR logic 133, respectively, of FIG. 1. When an operation of the coarse ADC 210 is completed, a differential residual voltage ($V_{RES}$) may remain in the CDAC 211.

In a third period D3, the differential residual voltage ($V_{RES}$) remaining in the CDAC 211 may be converted into the differential residual current ($I_{RES}$) by the amplifier 220 during a second sampling clock ($\Phi_{IS}$) (RA1). The differential residual current ($I_{RES}$) may be sampled by the amplifier 220.

In a fourth period D4, an operation of the coarse ADC 210 is in progress (S[2] and CC2), and the differential residual current ($I_{RES}$) may be converted into an M-bit digital signal by the fine ADC 230 during a second comparison clock ($\Phi_{F-SAR}$) and output (FC2).

After the amplifier 220 converts the differential residual voltage ($V_{RES}$) into the differential residual current ($I_{RES}$), the amplifier 220 may receive the differential test voltage ($V_{TEST}$) from the first selector 260. The amplifier 220 may amplify the differential test voltage ($V_{TEST}$) by a predetermined gain Gm to generate the differential test current ($I_{TEST}$). The amplifier 220 may sample the generated differential test current ($I_{TEST}$) in response to the correction sampling clock ($\Phi_{IS-CAL}$), and maintain the sampled differential test current at a constant value for a predetermined period.

Regardless of an operating time of the fine ADC 230, the auxiliary path 270 may generate the gain correction signal ($V_{CAL}$) used to correct the gain of the amplifier 220 (CAL2). The IDAC 271 of the auxiliary path 270 may receive the differential test current ($I_{TEST}$) and the reference current ($I_{REF}$). The differential test current ($I_{TEST}$) may be an IDAC input current. The IDAC 271 may receive the reference current ($I_{REF}$), and may generate an IDAC reference current using the reference current ($I_{REF}$). The IDAC 271 may output the second differential voltage ($V_{DIFF}2$) corresponding to a difference between the IDAC input current and the IDAC reference current using the resistor ($R_T$).

The comparator 272 may compare the second differential voltage ($V_{DIFF}2$) in response to a correction comparison clock ($\Phi_{F-CAL}$) and output a result of the comparison. For example, the comparator 272 may compare a full scale of the differential test current ($I_{TEST}$) with a full scale of the reference current ($I_{REF}$), and output a result of the comparison as the gain correction signal ($V_{CAL}$).

Based on the gain correction signal ($V_{CAL}$) output from the comparator 272, the gain correction circuit 280 may generate the control signal CTRL that controls the amplifier 220 so that the amplifier 220 corrects a gain of the amplifier 220.

Therefore, a time it takes to output a (N+M−1)-bit digital signal (D1+D2+D3) in the example embodiment of FIG. 4 may be further reduced compared to the time it takes to output the (N+M−1)-bit digital signal (D1+D2+D3) in the example embodiment of FIG. 2.

According to an example embodiment of the present inventive concept, a circuit that corrects a gain of the amplifier 220 may be added to the voltage-current domain pipeline SAR ADC 200, so that the gain of the amplifier 220 may be corrected regardless of the operation time of the fine ADC 230. Therefore, while correcting the gain of the amplifier 220 in the background, the operation speed of the ADC may be increased or maximized.

The comparators 232 and 272 may generate an offset error. Accordingly, when the gain of the amplifier 220 is corrected using the auxiliary path 270, an offset error of the comparator 272 included in the auxiliary path 270 may be reflected. When the ADC operates normally with the corrected gain after the gain of the amplifier 220 is corrected, an offset error of the comparator 232 included in the fine ADC 230 may be additionally reflected and an offset error may be accumulated.

According to an example embodiment of the present inventive concept, a circuit that corrects a gain of an amplifier may be added to the voltage-current domain pipeline SAR ADC, and the added circuit may share a comparator of the fine ADC. Accordingly, an offset error may be reduced or minimized, and power consumption may be reduced, while correcting the gain of the amplifier in the background according to example embodiments of the inventive concept.

Figure 6:
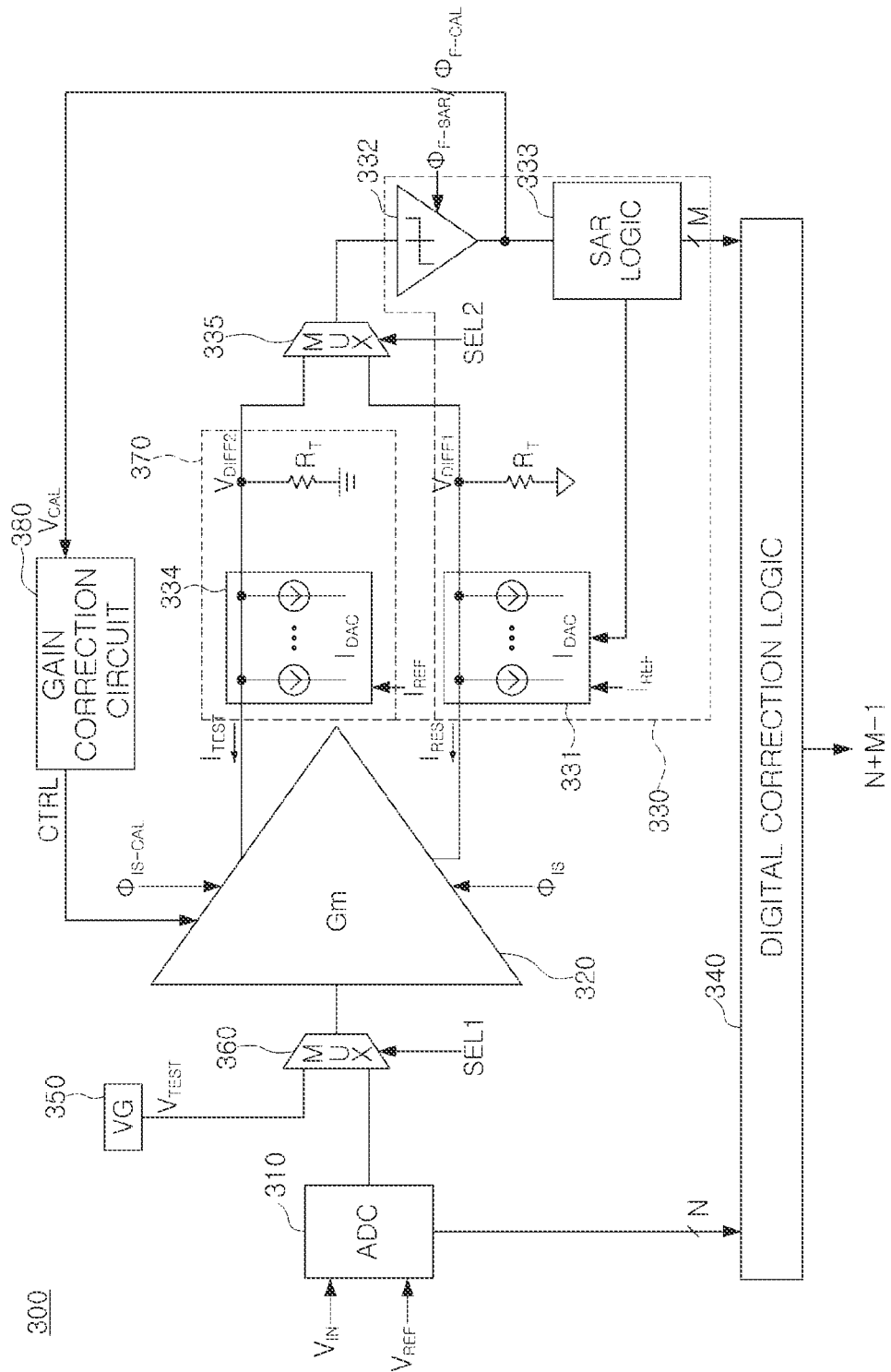
FIG. 6 is a diagram illustrating a method of correcting a gain of an amplifier by a voltage-current domain pipeline SAR ADC according to an example embodiment of the present inventive concept.

FIG. 6 is a diagram illustrating a method of correcting a gain of an amplifier by a voltage-current domain pipeline SAR ADC according to an example embodiment of the present inventive concept.

Referring to FIG. 6, the differences between FIG. 6 and FIG. 4 are primarily described, and a further description of components and technical aspects previously described may be omitted for convenience of explanation. Referring to FIG. 6, a voltage-current domain pipeline SAR ADC 300 may further include an auxiliary path 370 including an IDAC 334, which may be the same as or similar to an IDAC 331 of a fine ADC 330 and which corrects a gain of an amplifier 320, and may further include a second selector 335 utilized for the auxiliary path 370 to share the comparator 332 of the fine ADC 330. The auxiliary path 370, the IDAC 331, the fine ADC 330, the amplifier 320, and the comparator 332 of FIG. 6 may be the same as or similar to the auxiliary path 270, the IDAC 231, the fine ADC 230 the amplifier 220, and the comparator 232, respectively, of FIG. 4. In addition, an ADC 310, a SAR logic 333, a digital correction logic 340, a test voltage generator 350, and a first selector 360 of FIG. 6 may be the same as or similar to the ADC 210, the SAR logic 233, the digital correction logic 240, the test voltage generator 250, and the first selector 260 of FIG. 4.

The second selector 335 may receive a first differential voltage ($V_{DIFF}1$) from the IDAC 331 of the fine ADC 330, and a second differential voltage ($V_{DIFF}2$) from the IDAC 334 of the auxiliary path 370. The second selector 335 may output one of the first differential voltage ($V_{DIFF}1$) and the second differential voltage ($V_{DIFF}2$) in response to a second selection signal SEL2.

While the fine ADC 330 converts the differential residual current ($I_{RES}$) into an M-bit digital signal, the auxiliary path 370 may output the second differential voltage ($V_{DIFF}2$) corresponding to a difference between the differential test current ($I_{TEST}$) and the reference current ($I_{REF}$) using the resistor ($R_T$). The comparator 332 of the fine ADC 330 may receive the second differential voltage ($V_{DIFF}2$) from the second selector 335. The comparator 332 may compare the second differential voltage ($V_{DIFF}2$) in response to the correction comparison clock ($\Phi_{F-CAL}$) and output a result of the comparison as the gain correction signal ($V_{CAL}$).

Based on the gain correction signal ($V_{CAL}$) output from the comparator 332, a gain correction circuit 380 may generate the control signal CTRL used to control the amplifier 320 so that the amplifier 320 corrects the gain of the amplifier 320.

Figure 7:
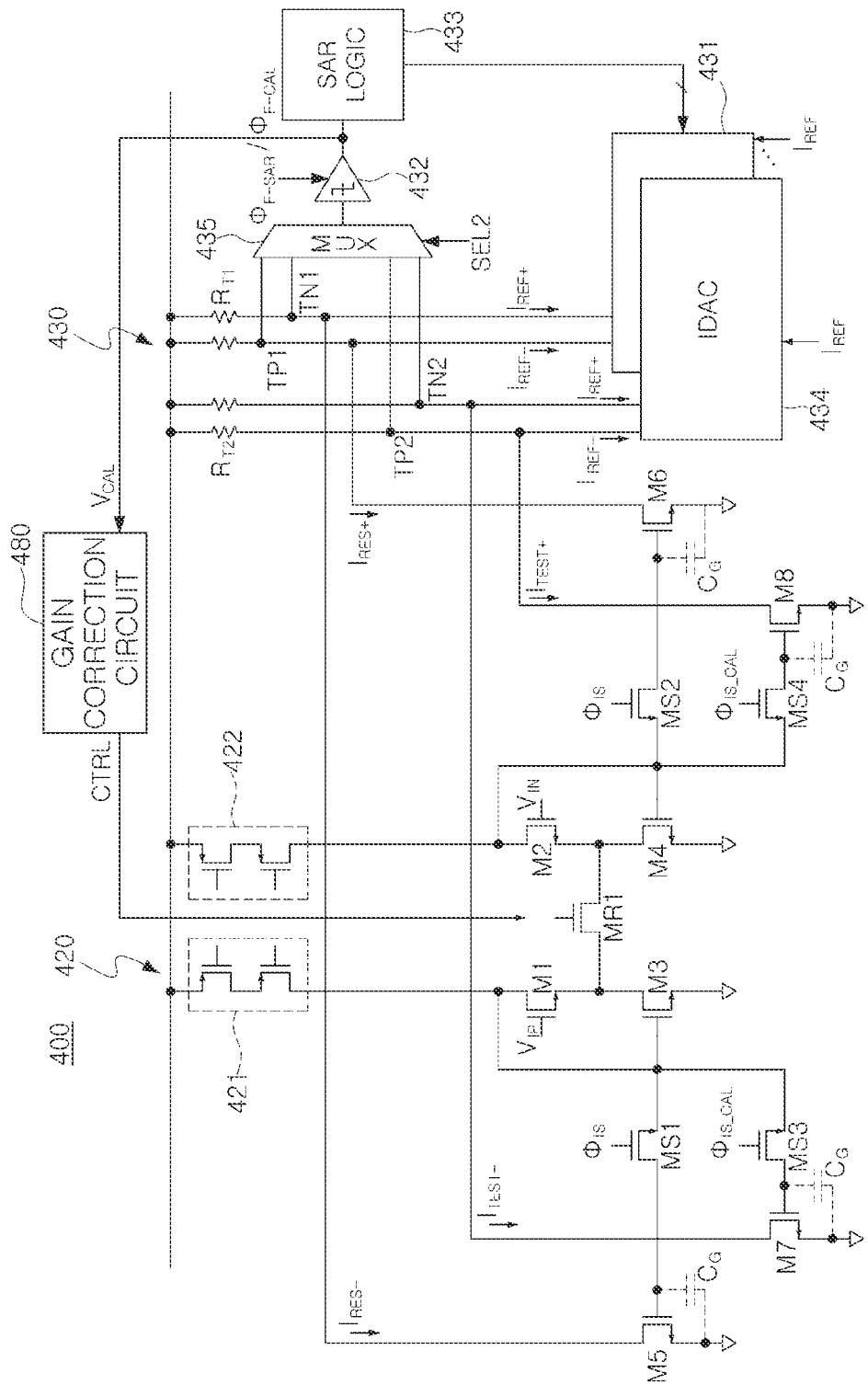
FIG. 7 is a circuit diagram of a voltage-current domain pipeline SAR ADC according to an example embodiment of the present inventive concept.
Figure 8:
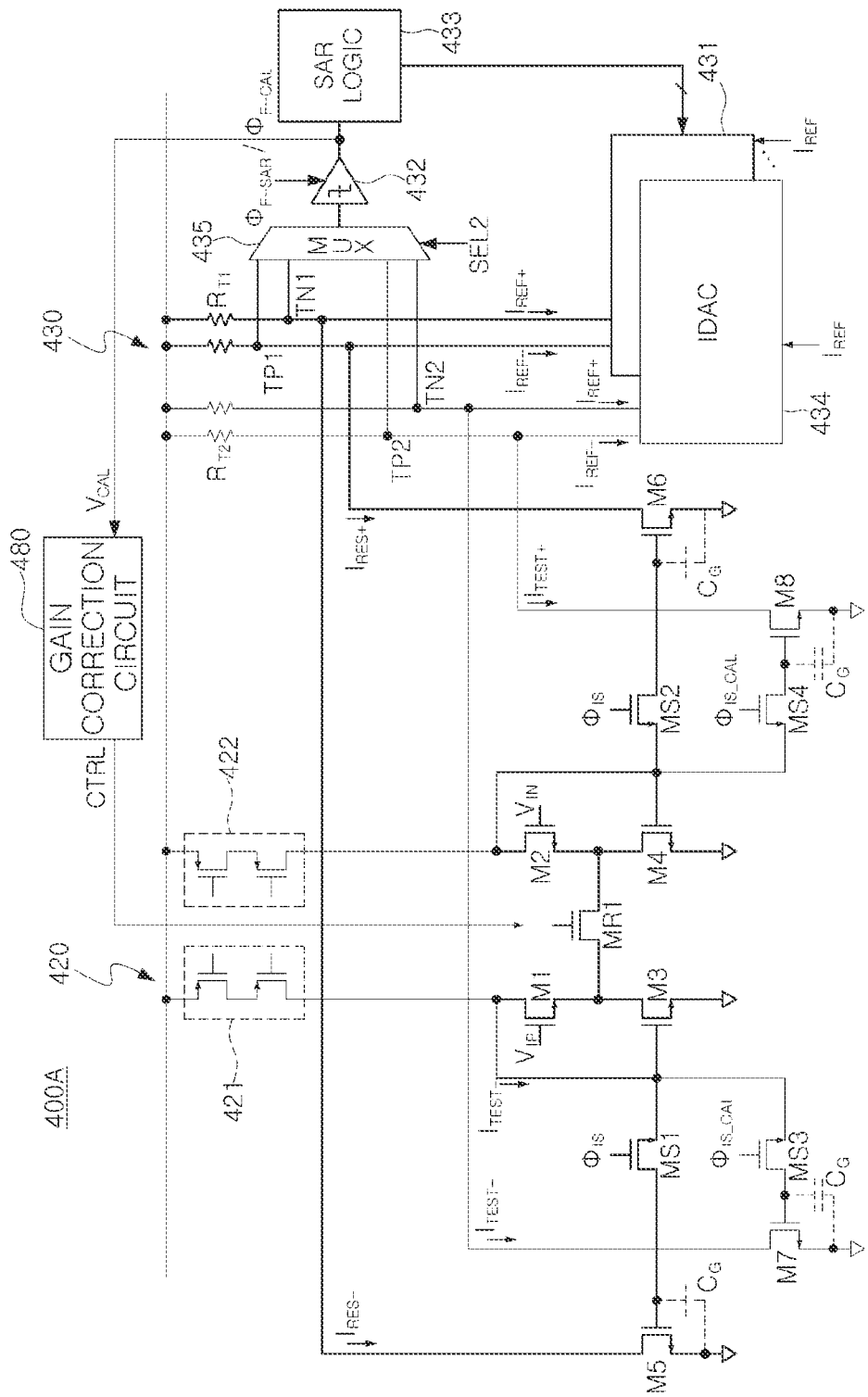
FIG. 8 is a diagram illustrating a normal operation path of a voltage-current domain pipeline SAR ADC according to an embodiment of the present example embodiment of the present inventive concept.
Figure 9:
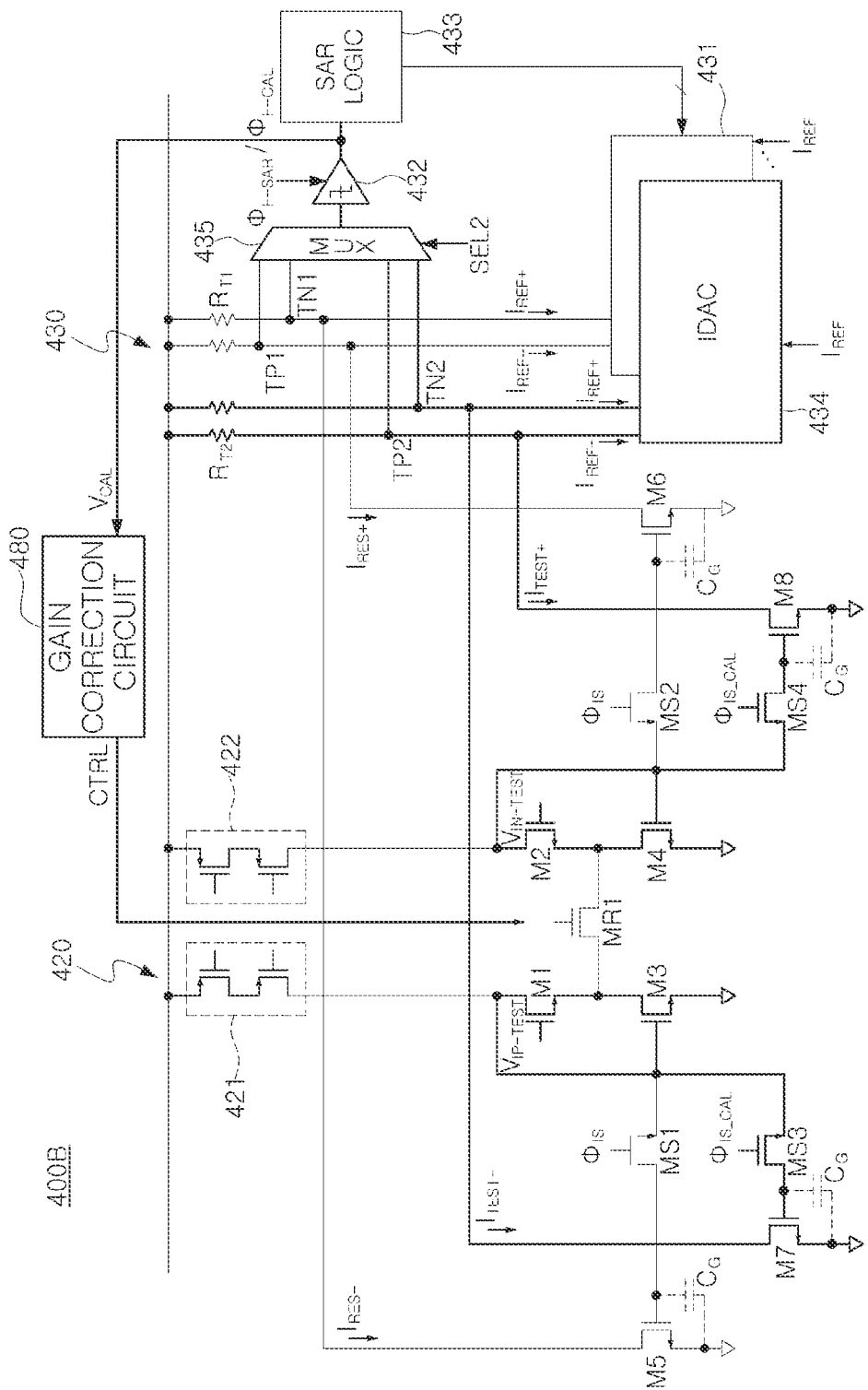
FIG. 9 illustrates a gain correction path of a voltage-current domain pipeline SAR ADC according to an example embodiment of the present inventive concept.

FIG. 7 is a circuit diagram of a voltage-current domain pipeline SAR ADC 400 according to an example embodiment of the present inventive concept. FIG. 8 is a diagram illustrating a normal operation path of a voltage-current domain pipeline SAR ADC 400A according to an example embodiment of the present inventive concept. FIG. 9 illustrates a gain correction path of a voltage-current domain pipeline SAR ADC 400B according to an example embodiment of the present inventive concept.

Referring to FIG. 7, a voltage-current domain pipeline SAR ADC 400 may include an amplifier 420, a fine ADC 430, and a gain correction circuit 480.

The amplifier 420 may include a switch MR1 for linear voltage-current conversion, and first switched current samplers M3, M5, MS1, M4, M6, and MS2 for sampling a current. The amplifier 420 may further include bias circuits 421 and 422 for driving transistors included in input stages M1 to M4.

The amplifier 420 may further include second switched current samplers M3, M7, MS3, M4, M8, and MS4 for correcting a gain of the amplifier 420.

The fine ADC 430 may include a first IDAC 431, a comparator 432, an SAR logic 433, and a first resistor ($R_T1$). The voltage-current domain pipeline SAR ADC may further include a second IDAC 434, a second selector 435, and a second resistor ($R_T2$) for correcting a gain of the amplifier. The second IDAC 434 and the second resistor ($R_T2$) may correspond to an auxiliary path.

Referring to FIG. 8, the amplifier 420 may receive differential residual voltages $V_{IP}$ and $V_{IN}$ generated by the coarse ADC through a selector. The amplifier 420 may convert the differential residual voltages $V_{IP}$ and $V_{IN}$ into differential residual currents $I_{RES+}$ and $I_{RES-}$. The amplifier 420 may maintain charges corresponding to the differential residual currents $I_{RES+}$ and $I_{RES-}$ in a gate capacitance ($C_G$) by a sampling clock ($\Phi_{IS}$). Accordingly, the amplifier 420 may sample the differential residual currents $I_{RES+}$ and $I_{RES-}$, and maintain the sampled residual current at a constant value for a predetermined period.

After the amplifier 120 converts the differential residual voltage ($V_{RES}$) into a differential residual current ($I_{RES}$), as shown in FIG. 9, the amplifier 420 may receive differential test voltages $V_{IP-TEST}$ and $V_{IN-TEST}$ generated by a test voltage generator through a selector. The amplifier 420 may convert the differential test voltages $V_{IP-TEST}$ and $V_{IN-TEST}$ into differential test currents $I_{TEST+}$ and $I_{TEST-}$. The amplifier 420 may maintain charges corresponding to the differential test currents $I_{TEST+}$ and $I_{TEST-}$ in the gate capacitance ($C_G$) by a correction sampling clock ($\Phi_{IS-CAL}$). Accordingly, the amplifier 420 may sample the differential test currents $I_{TEST+}$ and $I_{TEST-}$, and maintain the sampled test current at a constant value for a predetermined period.

Referring back to FIG. 8, the fine ADC 430 may receive a residual current sampled by the amplifier 420. The residual current sampled by the amplifier 420 may be an IDAC input current. An IDAC 431 may receive a reference current ($I_{REF}$), and generate IDAC reference currents $I_{REF+}$ and $I_{REF-}$ by using the reference current ($I_{REF}$). The IDAC 431 may output first differential voltages TP1 and TN1 corresponding to a difference between the IDAC input current and the IDAC reference current $I_{REF+}$ and $I_{REF-}$ using the first resistor ($R_T1$).

For example, an output of the IDAC 431 may correspond to the following equation [Equation 1].

$$\begin{aligned}\text{an output of an IDAC} &= \text{a first differential voltage} = TP1 - TP2 \\ &= \{[(I_{RES+}) + (I_{REF-})] - [(I_{RES-}) + (I_{REF+})]\} * RT \\ &= \{[(I_{RES+}) - (I_{RES-})] - [(I_{REF+}) - (I_{REF-})]\} * RT \\ &= \{(\text{a difference in a residual current}) - (\text{a difference in a reference current})\} * RT \end{aligned}$$ [Equation 1]

A second selector 435 may receive the first differential voltages TP1 and TN1 from the IDAC 431. The second selector 435 may output the first differential voltages TP1 and TN1 to the comparator 432 in response to a second selection signal SEL2.

The comparator 432 may compare the first differential voltages TP1 and TN1 in response to a second comparison clock ($\Phi_{F-SAR}$), and output a result of the comparison. The comparator 432 may determine which of TP1 and TN1 is larger and which is smaller. For example, the comparator 432 may compare whether (TP1−TN1) is greater than or less than 0, and output a result of the comparison. The SAR logic 433 may output a bit of the M-bit digital signal based on a result of the comparison output from the comparator 432.

After the fine ADC 430 determines all of the bits of the M-bit digital signal from the differential residual current ($I_{RES}$), as shown in FIG. 9, the IDAC 434 of the auxiliary path may receive differential test currents $I_{TEST+}$ and $I_{TEST-}$ from the amplifier 420. The differential test currents $I_{TEST+}$ and $I_{TEST-}$ may be IDAC input currents. The IDAC 434 may receive a reference current ($I_{REF}$), and generate IDAC reference currents $I_{REF+}$ and $I_{REF-}$ using the reference current ($I_{REF}$). The IDAC 434 may output second differential voltages TP2 and TN2 corresponding to a difference between the IDAC input current and the IDAC reference current $I_{REF+}$ and $I_{REF-}$ using the second resistor ($R_T2$).

The second selector 435 may receive the second differential voltages TP2 and TN2 from the IDAC 434. The second selector 435 may output the second differential voltages TP2 and TN2 to the comparator 432 in response to the second selection signal SEL2.

The comparator 432 may compare the second differential voltages TP2 and TN2 in response to a correction comparison clock ($\Phi_{F-CAL}$), and output a result of the comparison as a gain correction signal ($V_{CAL}$). Based on the gain correction signal ($V_{CAL}$) output from the comparator 432, a gain correction circuit 480 may generate a control signal CTRL controlling the amplifier 420 so that the amplifier 420 corrects a gain of the amplifier 420. For example, if an output of the comparator 432 is data '0', it may be determined that a gain of the amplifier 420 has decreased. Conversely, if the output of the comparator 432 is data '1', it may be determined that the gain of the amplifier 420 is increased. When the output of the comparator 432 alternately and repeatedly outputs data "0" and data "1", it may be determined that the gain of the amplifier 420 is normal.

The control signal CTRL may be a signal for adjusting a gate voltage of the switch MR1. The gain of the amplifier 420 may be adjusted by adjusting the gate voltage of the switch MR1 by the control signal CTRL.

Figure 10:
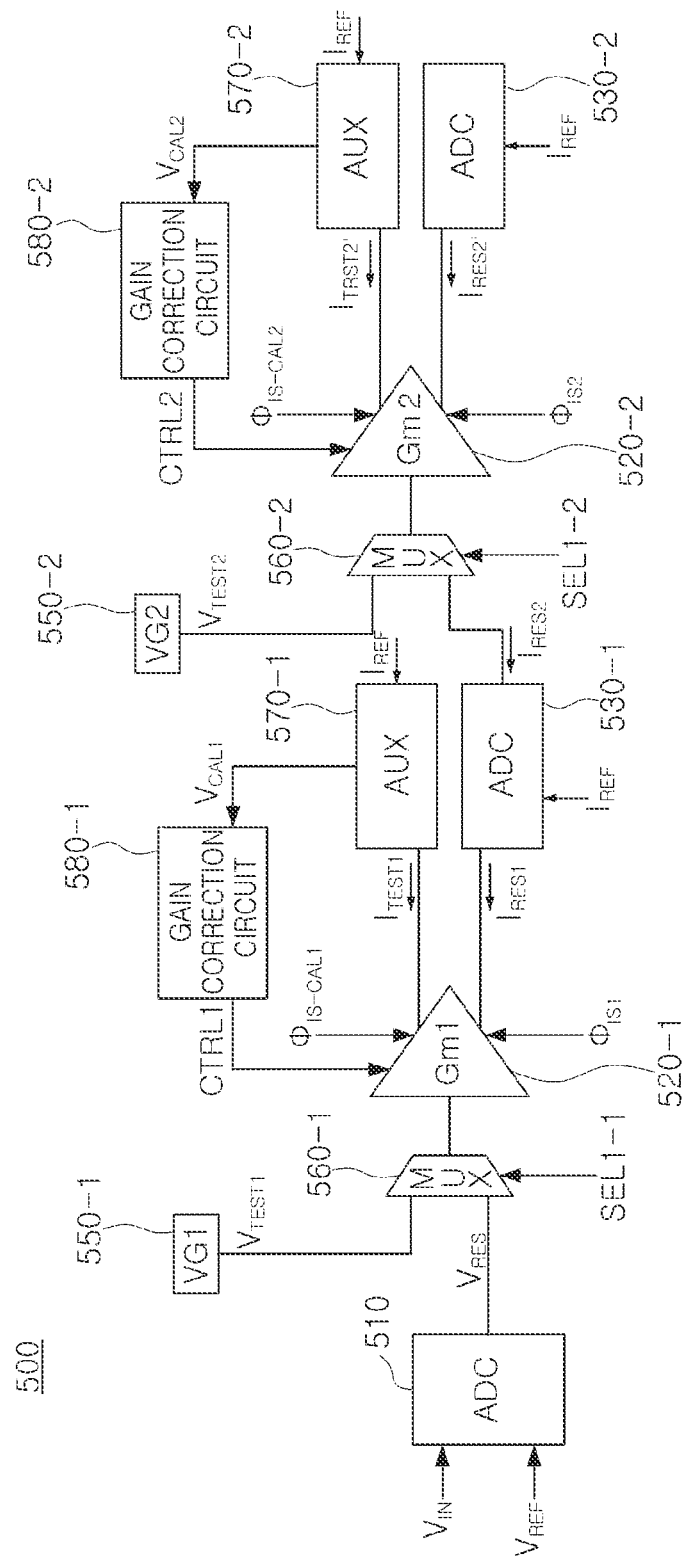
FIG. 10 illustrates a structure of a voltage-current domain pipeline SAR ADC according to an example embodiment of the present inventive concept.

FIG. 10 illustrates a structure of a voltage-current domain pipeline SAR ADC according to an example embodiment of the present inventive concept. Unlike the voltage-current domain pipeline SAR ADC 100 of FIG. 1, a voltage-current domain pipeline SAR ADC 500 of FIG. 10 may additionally implement a pipeline in a current domain through SAR ADC using an amplifier with a sampling and hold operation and IDAC.

The voltage-current domain pipeline SAR ADC 500 may include a coarse ADC 510, a first amplifier 520-1, a first fine ADC 530-1, a second amplifier 520-2, and a second fine ADC 530-2.

For example, assuming that the coarse ADC 110 can output a 6-bit digital signal and the fine ADC 130 can output a 5-bit digital signal in FIG. 1, the coarse ADC 510 can output a 6-bit digital signal, the first fine ADC 530-1 can output a 2-bit digital signal, and the second fine ADC 530-2 can output a remaining 4-bit digital signal in FIG. 10.

The voltage-current domain pipeline SAR ADC 500 according to an example embodiment of the present inventive concept may further include a circuit for correcting a gain of an amplifier for each stage. The voltage-current domain pipeline SAR ADC 500 may further include a first test voltage generator 550-1, a first selector 560-1, a first auxiliary path 570-1, and a first gain correction circuit 580-1 to correct a gain of the first amplifier 520-1, and further include a second test voltage generator 550-2, a second selector 560-2, a second gain correction circuit 580-2, and a second auxiliary path 570-2 to correct a gain of the second amplifier 520-2.

For example, the first selector 560-1 may receive a differential residual voltage ($V_{RES}$) from the coarse ADC 510, and may receive a first differential test voltage ($V_{TEST1}$) from the first test voltage generator 550-1. The first selector 560-1 may output one of the differential residual voltage ($V_{RES}$) and the first differential test voltage ($V_{TEST}1$) in response to a first selection signal SEL1-1.

When the first amplifier 520-1 receives the differential residual voltage ($V_{RES}$) from the first selector 560-1, the first amplifier 520-1 may amplify the differential residual voltage ($V_{RES}$) by a predetermined gain Gm1 to generate a first differential residual current ($I_{RES}1$). The first amplifier 520-1 may sample the first differential residual current ($I_{RES}1$) in response to a first sampling clock ($\Phi_{IS1}$). The first fine ADC 530-1 may output the first differential residual current ($I_{RES1}$) as a 2-bit digital signal.

After the first amplifier 520-1 converts the differential residual voltage ($V_{RES}$) into the first differential residual current ($I_{RES}1$), the first amplifier 520-1 may receive the first differential test voltage ($V_{TEST}1$) from the first selector 560-1. The first amplifier 520-1 may amplify the first differential test voltage ($V_{TEST}1$) by a predetermined gain Gm1 to generate a first differential test current ($I_{TEST}1$). The first amplifier 520-1 may sample the first differential test current ($I_{TEST}$) in response to a first correction sampling clock ($\Phi_{IS-CAL}1$), and maintain the sampled first differential test current at a constant value for a predetermined period.

The first auxiliary path 570-1 may compare a full scale of the first differential test current sampled by the first amplifier 520-1 with a full scale of a reference current ($I_{REF}$), and output a result of the comparison as a first gain signal ($V_{CAL}1$). Based on the first gain correction signal ($V_{CAL}1$) output from the first auxiliary path 570-1, the first gain correction circuit 580-1 may generate a first control signal CTRL1 controlling the first amplifier 520-1 such that the first amplifier 520-1 corrects the gain of the first amplifier 520-1.

When an operation of the first fine ADC 530-1 is completed, a second differential residual current ($I_{RES2}$) may remain in the IDAC of the first fine ADC 530-1. The second selector 560-2 may receive the second differential residual current ($I_{RES2}$) from the first fine ADC 530-1, and may receive a second differential test voltage ($V_{TEST}2$) from the second test voltage generator 550-2. The second selector 560-2 may output one of the second differential residual current ($I_{RES2}$) and the second differential test voltage ($V_{TEST}2$) in response to a second selection signal SEL1-2.

When the second amplifier 520-2 receives the second differential residual current ($I_{RES2}$) from the second selector 560-2, the second amplifier 520-2 may amplify the second differential residual current ($I_{RES2}$) by a predetermined gain Gm2 to generate an amplified second differential residual current ($I_{RES}2'$). The second amplifier 520-2 may sample the amplified second differential residual current ($I_{RES}2'$) in response to a second sampling clock ($\Phi_{IS2}$). The second fine ADC 530-2 may output the amplified second differential residual current ($I_{RES}2'$) as a 4-bit digital signal.

After the second amplifier 520-2 converts the second differential residual current ($I_{RES2}$) into the second differential residual current ($I_{RES}2'$), the second amplifier 520-2 may receive the second differential test voltage ($V_{TEST}2$) from the second selector 560-2. The second amplifier 520-2 may amplify the second differential test voltage ($V_{TEST}2$) by a predetermined gain Gm2 to generate an amplified second differential test current ($I_{TEST}2'$). The second amplifier 520-2 may sample the amplified second differential test current ($I_{TEST}2'$) in response to a second correction sampling clock ($\Phi_{IS-CAL}2$), and maintain the sampled second differential test current at a constant value for a predetermined period.

The second auxiliary path 570-2 may compare a full scale of the second differential test current sampled by the second amplifier 520-2 with a full scale of a reference current ($I_{REF}$), and output a result of the comparison as a second gain correction signal ($V_{CAL}2$). Based on the second gain correction signal ($V_{CAL}2$) output from the second auxiliary path 570-2, the second gain correction circuit 580-2 may generate a second control signal CTRL2 controlling the second amplifier 520-2 such that the second amplifier 520-2 corrects the gain of the second amplifier 520-2

The voltage-current domain pipeline SAR ADC 500 according to an example embodiment of the present inventive concept has an effect of having a high resolution while maintaining a high-speed operation.

Figure 11:
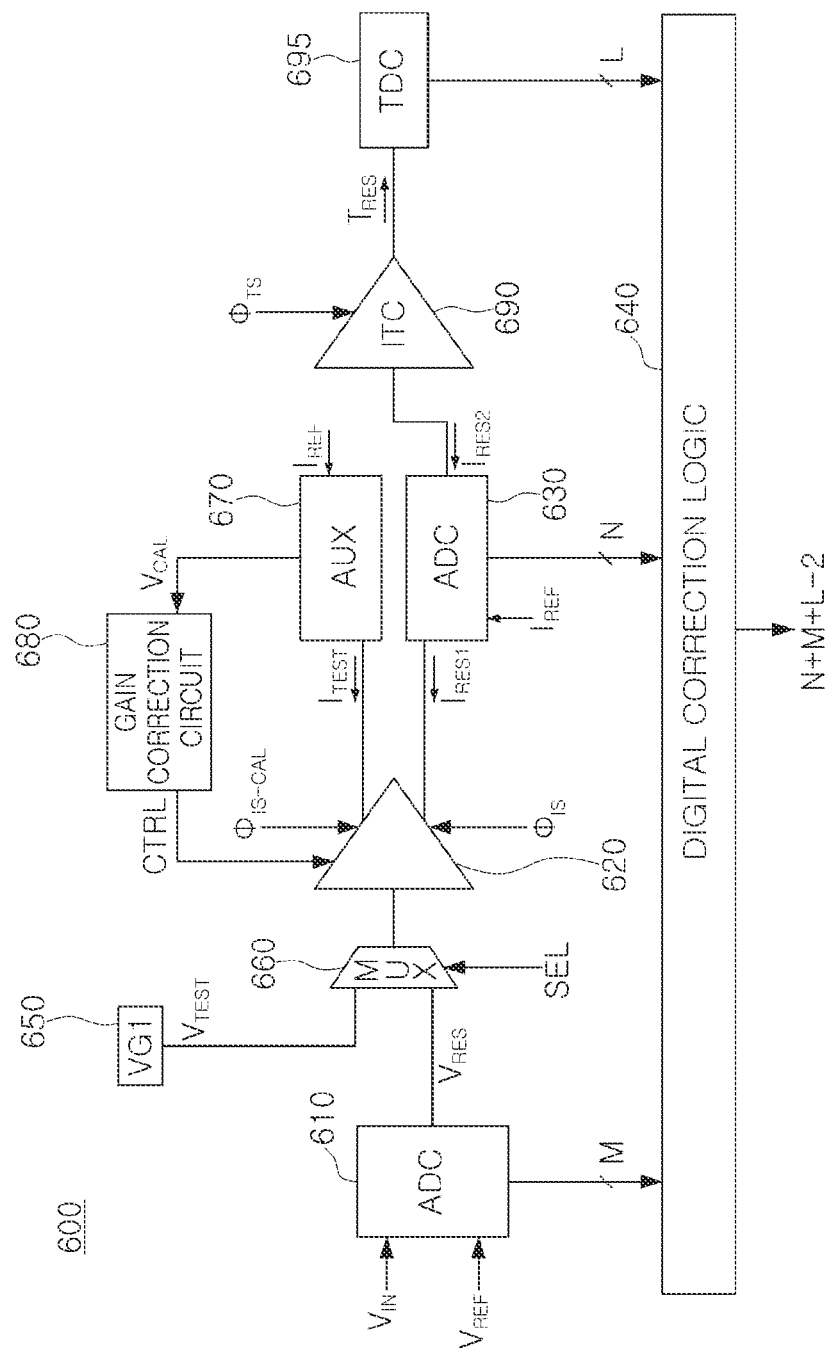
FIG. 11 illustrates a structure of a voltage-current-time domain pipeline ADC according to an example embodiment of the present inventive concept.

FIG. 11 illustrates a structure of a voltage-current-time domain pipeline ADC according to an example embodiment of the present inventive concept.

Referring to FIG. 11, a voltage-current-time domain pipeline ADC 600 may generate a sequence of digital codes (e.g., (M+N+L−2)-bit digital signals) representing respective levels of an analog input voltage ($V_{IN}$) using ADC of a voltage, a current, and a time domain, where M, N and L are natural numbers. The voltage-current-time domain pipeline SAR ADC 600 may include a coarse ADC 610, an amplifier 620, a fine ADC 630, a current-time converter (ITC) 690, a time-digital converter (TDC) 695, and a digital correction logic 640. The coarse ADC 610, the amplifier 620, and the fine ADC 630 may correspond to a voltage-to-current converter.

The voltage-current-time domain pipeline ADC 600 according to an example embodiment of the present inventive concept may further include a test voltage generator 650, a selector 660, an auxiliary path 670, and a gain correction circuit 680 to correct a gain of the amplifier 620.

The coarse ADC 610 may output an M-bit digital signal from the analog input voltage ($V_{IN}$) using an SAR method.

The selector 660 may receive a differential residual voltage ($V_{RES}$) from the coarse ADC 610, and may receive a differential test voltage ($V_{TEST}$) from the test voltage generator 650. The selector 660 may output one of the differential residual voltage ($V_{RES}$) and the differential test voltage ($V_{TEST}$) in response to a selection signal SEL.

When the amplifier 620 receives the differential residual voltage ($V_{RES}$) from the selector 660, the amplifier 620 may amplify the differential residual voltage ($V_{RES}$) by a predetermined gain to generate a first differential current ($I_{RES}1$) in a current domain. The amplifier 620 may sample the first differential residual current ($I_{RES}1$) in response to a first sampling clock ($\Phi_{IS}$). The fine ADC 630 may output the first differential residual current ($I_{RES}1$) as an N-bit digital signal.

After the amplifier 620 converts the differential residual voltage ($V_{RES}$) into the first differential residual current ($I_{RES}1$), the amplifier 620 may receive the differential test voltage ($V_{TEST}$) from the selector 660. The amplifier 620 may amplify the differential test voltage ($V_{TEST}$) by a predetermined gain to generate a differential test current ($I_{TEST}$). The amplifier 620 may sample the generated differential test current ($I_{TEST}$) in response to a correction sampling clock ($\Phi_{IS\text{-}CAL}$), and maintain the sampled first differential test current at a constant value for a predetermined period.

The auxiliary path 670 may compare a full scale of the first differential test current sampled by the amplifier 620 with a full scale of the reference current ($I_{REF}$), and output a result of the comparison as a gain correction signal ($V_{CAL}$). The gain correction circuit 680 may generate a control signal CTRL controlling the amplifier 620 such that the amplifier 620 corrects the gain of the amplifier 620 based on the gain correction signal ($V_{CAL}$) output from the fine ADC 630.

When an operation of the fine ADC 630 is completed, a second differential residual current ($I_{RES2}$) may remain in the IDAC of the fine ADC 630. In response to a complementary signal of the second sampling clock ($\Phi_{TS}$), the ITC 690 may receive the second differential residual current ($I_{RES}2$) from the fine ADC 630. In response to the second sampling clock ($\Phi_{TS}$), the ITC 690 may perform current-time conversion from the second differential residual current ($I_{RES2}$) to a residual time ($T_{RES}$) in the time domain.

The TDC 695 may receive the differential residence time ($T_{RES}$) from the ITC 690, and output an L-bit digital signal.

The digital correction logic 640 may receive an M-bit digital signal from the coarse ADC 610, receive an N-bit digital signal from the fine ADC 630, and receive an L-bit digital signal from the TDC 695. When a 1-bit redundancy exists between the coarse ADC 610 and the fine ADC 630, and a 1-bit redundancy exists between the fine ADC 630 and the TDC 695, the digital correction logic 640 may combine an M-bit digital signal, an N-bit digital signal, and an L-bit digital signal to generate a (M+N+L−2)-bit digital signal.

The voltage-current-time domain pipeline ADC 600 according to an example embodiment of the present inventive concept may be pipelined by using a time domain ADC (e.g., TDC) at a rear end of the voltage-current domain pipeline SAR ADC. Therefore, example embodiments may increase or maximize an operating speed of an ADC while reducing or minimizing power consumption of the ADC.

As set forth above, according to an example embodiment of the present inventive concept, an operation speed of a voltage-current domain pipeline SAR ADC may be increased or maximized by correcting an interstage gain error irrespective of a normal operation time of ADC.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. An analog-to-digital converter (ADC), comprising:
   a coarse ADC that receives an analog input voltage, generates a first digital signal based on the analog input voltage using a successive approximation register (SAR) method, and outputs a residual voltage remaining after the first digital signal is generated;
   an amplifier that receives the residual voltage and a test voltage, generates a residual current by amplifying the residual voltage by a predetermined gain, and generates a test current by amplifying the test voltage by the gain;
   a fine ADC that receives the residual current, and generates a second digital signal based on the residual current using the SAR method; and
   an auxiliary path that receives the test current, and generates a gain correction signal based on the test current,
   wherein the gain of the amplifier is adjusted based on the gain correction signal.

2. The ADC of claim 1, further comprising:
   a selector that outputs one of the residual voltage and the test voltage to the amplifier in response to a selection signal,
   wherein the amplifier receives the residual voltage from the selector and converts the residual voltage into the residual current, and then receives the test voltage from the selector and converts the test voltage into the test current.

3. The ADC of claim 1, wherein the fine ADC comprises:
   a first current digital-to-analog converter (IDAC) that outputs a differential voltage determined by a difference between the residual current and a reference current;
   a first comparator that compares the differential voltage and outputs a result of the comparison; and
   an SAR logic that outputs a digital signal based on the result of the comparison,
   wherein the auxiliary path comprises a second IDAC and a second comparator, and the second IDAC and the second comparator have a same configuration as the first IDAC and the first comparator, respectively.

4. The ADC of claim 1, wherein the amplifier converts the residual voltage into the residual current using a first switched current sampler, and converts the test voltage into the test current using a second switched current sampler.

5. The ADC of claim 1, wherein the fine ADC comprises:
a first current digital-to-analog converter (IDAC) that outputs a first differential voltage determined by a difference between the residual current and a reference current;
a comparator that compares the first differential voltage, and outputs a result of the comparison; and
an SAR logic that outputs a third digital signal based on the result of the comparison,
wherein the auxiliary path comprises a second IDAC that outputs a second differential voltage determined by a difference between the test current and the reference current,
wherein the first IDAC and the second IDAC share the comparator.

6. The ADC of claim 5, wherein the first IDAC and the second IDAC have a same configuration.

7. The ADC of claim 5, further comprising:
a selector that outputs one of the first differential voltage and the second differential voltage to the comparator in response to a selection signal.

8. An analog-to-digital converter (ADC), comprising:
a coarse ADC that samples an analog input voltage for a first period, generates a first digital signal based on the analog input voltage using a successive approximation register (SAR) method for a second period, and outputs a residual voltage remaining after the first digital signal is generated;
an amplifier that receives the residual voltage for a third period, and generates a residual current by amplifying the residual voltage by a predetermined gain;
a fine ADC that receives the residual current for a fourth period, and generates a second digital signal based on the residual current using the SAR method; and
an auxiliary path that receives a test current and generates a gain correction signal based on the test current,
wherein the gain of the amplifier is adjusted for the fourth period in which the fine ADC generates the second digital signal based on the residual current.

9. The ADC of claim 8, wherein, after the third period in which the amplifier generates the residual current by amplifying the residual voltage, the amplifier receives a test voltage and generates the test current by amplifying the test voltage by the gain.

10. The ADC of claim 9, wherein the auxiliary path compares a full scale of the test current with a full scale of a reference current for the fourth period, and generates the gain correction signal such that the full scale of the test current and the full scale of the reference scale match.

11. The ADC of claim 9, wherein the amplifier samples the test current in response to a correction sampling clock for the fourth period,
wherein the auxiliary path compares a differential voltage determined by a difference between the test current and a reference current in response to a correction comparison clock for the fourth period, and outputs a result of the comparison as the gain correction signal.

12. The ADC of claim 8, wherein the coarse ADC receives a following analog input voltage during the fourth period, and generates a third digital signal based on the following analog input voltage using the SAR method.

13. An analog-to-digital converter (ADC), comprising:
a coarse ADC that receives an analog input voltage, generates a first digital signal based on the analog input voltage using a successive approximation register (SAR) method, and outputs a residual voltage remaining after the first digital signal is generated;
a test voltage generator that outputs a test voltage;
a selector that outputs one of the residual voltage and the test voltage in response to a selection signal;
an amplifier that receives the residual voltage and the test voltage from the selector, generates a first residual current by amplifying the residual voltage by a predetermined gain, and generates a test current by amplifying the test voltage by the gain;
a fine ADC that receives the first residual current, generates a second digital signal based on the first residual current using the SAR method, and outputs a second residual current remaining after the second digital signal is generated;
an auxiliary path that receives the test current, and generates a gain correction signal based on the test current, wherein the gain of the amplifier is adjusted based on the gain correction signal; and
a gain correction circuit that outputs a control signal that controls the amplifier such that the amplifier corrects the gain based on the gain correction signal,
wherein regardless of a time at which the fine ADC converts the first residual current into the second digital signal, the auxiliary path generates the gain correction signal based on the test current.

14. The ADC of claim 13, wherein the auxiliary path generates the gain correction signal based on the test current while the fine ADC converts the first residual current into the second digital signal.

15. The ADC of claim 13, wherein the auxiliary path compares a full scale of the test current with a full scale of a reference current, and generates the gain correction signal such that the full scale of the test current and the full scale of the reference current match.

* * * * *